United States Patent [19]

Matsui et al.

[11] Patent Number: 4,914,669
[45] Date of Patent: Apr. 3, 1990

[54] SEMICONDUCTOR LASER ARRAY APPARATUS

[75] Inventors: Sadayoshi Matsui, Tenri; Mototaka Taneya, Tsukuba; Mitsuhiro Matsumoto, Nara; Hiroyuki Hosoba, Tenri, all of Japan

[73] Assignee: Sharp Kabushiki Kaisha, Osaka, Japan

[21] Appl. No.: 222,968

[22] Filed: Jul. 22, 1988

[30] Foreign Application Priority Data

Jul. 31, 1987 [JP] Japan .................................. 62-193473

[51] Int. Cl.$^4$ .............................................. H01S 3/19
[52] U.S. Cl. ........................................ 372/50; 372/29; 372/46; 372/48; 372/49
[58] Field of Search ................... 372/50, 49, 29, 46, 372/44, 45, 48

[56] References Cited

U.S. PATENT DOCUMENTS 4,772,082  9/1988  Matsui et al. ...................... 372/50

Primary Examiner—James W. Davie
Attorney, Agent, or Firm—Irell & Manella

[57] ABSTRACT

A semiconductor laser array apparatus comprising a single substrate and a plurality of semiconductor laser devices that are disposed with a given pitch on the substrate, some of the semiconductor laser devices constituting laser devices of a laser oscillation-operating area of the semiconductor laser array apparatus and the other semiconductor laser devices constituting laser devices of the non-laser oscillation-operating areas that are positioned outside of the laser oscillation-operating area, wherein the oscillation threshold current level of at least one of the semiconductor laser devices of each of the non-laser oscillation-operating areas that is the closest to the laser oscillation-operating area is higher than those of the semiconductor laser devices of the laser oscillation-operating area.

5 Claims, 4 Drawing Sheets

4,914,669

SEMICONDUCTOR LASER ARRAY APPARATUS

BACKGROUND OF THE INVENTION

1. Field of the invention

This invention relates to a semiconductor laser array apparatus in which the oscillation threshold current level of the semiconductor laser devices of the non-laser oscillation-operating areas is set to be so high that laser oscillation of the semiconductor laser devices of the non-laser oscillation-operating areas can be suppressed and laser oscillation in the laser oscillation-operating area alone can be achieved, resulting in a stabilized near-field pattern.

2. Description of the prior art

In recent years, high-output power semi-conductor laser array apparatuses in which a plurality of semiconductor laser devices are disposed with a certain gap therebetween on a single substrate have been developed. These semiconductor laser array apparatuses are produced by liquid phase epitaxy by the use of substrates with grooves so that light beams and current can be regulated.

FIG. 4 shows a conventional synchronous phase-type semiconductor laser array apparatus, which is produced as follows: On a p-GaAs substrate 1, an n-Ga$_{0.9}$Al$_{0.1}$As current blocking layer 2, and an n-GaAs current blocking layer 3 are successively formed by liquid phase epitaxy. Then, a plurality of grooves 4 are formed in a parallel manner, corresponding to the laser oscillation-operating area 5, in such a way that they reach the GaAs substrate 1 through the current blocking layers 2 and 3. Then, on the n-GaAs current blocking layer 3, a p-Ga$_{1-x}$Al$_x$As cladding layer 6, a p-(or n-)Ga$_{1-y}$Al$_y$As active layer 7, an n-Ga$_{1-x}$Al$_x$As cladding layer 8, and an n-GaAs cap layer 9 are successively formed by liquid phase epitaxy. A p-side electrode 11 and n-side electrode 12 are formed on the bottom face of the GaAs substrate 1 and the top surface of the n-GaAs cap layer 9, respectively. Current is injected into the active layer 7 through the grooves 4, resulting in optical waveguides within the active layer 7 that correspond to the grooves 4. The area including each of the grooves 4 constitutes an individual semiconductor laser device, and light beams that are oscillated by these laser devices are coupled therebetween, resulting in high-output power laser beams. However, in the laser oscillation-operating area 5 in which the grooves 4 are disposed, the top surface of the p-Ga$_{1-x}$Al$_x$As cladding layer 6 is bent, resulting in a bend of the active layer 7 formed thereon. Thus, the semiconductor laser devices become unsymmetrical, which makes weak the optical coupling between the adjacent semiconductor laser devices so that the semiconductor laser devices individually oscillate laser beams. That is, it is difficult for all of the semiconductor laser devices to attain uniform oscillation in the state that they are optically coupled therebetween.

To overcome this problem, semiconductor laser array apparatus shown in FIGS. 5 and 6 have been proposed. The semiconductor laser array apparatus of FIG. 5 has a plurality of grooves 4 with a certain pitch on the entire surface of a p-GaAs substrate 1 so that a uniform active layer 7 can be obtained. Moreover, this apparatus has an n-GaAs current blocking layer 26 between the p-GaAs substrate 1 and the n-Ga$_{0.9}$Al$_{0.1}$As current blocking layer 2 at the outside of the laser oscillation-operating area 5 so that current cannot be injected into the portions of the active layer 7 at the outside of the laser oscillation-operating area 5. The semiconductor laser array apparatus of FIG. 6 also has a plurality of grooves 4 with a certain pitch on the entire surface of the p-GaAs substrate 1. This apparatus has a proton-injected region 10 in both the n-GaAs cap layer 9 and the n-Ga$_{1-x}$Al$_x$As cladding layer 8 at the outside of the laser oscillation-operating area 5 so that the injection of current into the active layer 7 can be prevented.

However, these apparatus shown in FIGS. 5 and 6 have the grooves 4 in the non-laser oscillation-operating areas outside of the laser oscillation-operating area 5, and accordingly there is a possibility that optical coupling can be attained between the adjacent semiconductor laser devices in the non-laser oscillation-operating areas. Thus, when current injected into the active layer 7, leaks in the lateral direction, the semiconductor laser devices of the non-laser oscillation-operating areas attain laser oscillation and/or attain optical coupling therebetween, resulting in a bad influence on the oscillation mode of the laser oscillation-operating area 5.

SUMMARY OF THE INVENTION

The semiconductor laser array apparatus of this invention, which overcomes the above-discussed and numerous other disadvantages and deficiencies of the prior art, comprises a single substrate and a plurality of semiconductor laser devices that are disposed with a given pitch on said substrate, some of the semiconductor laser devices constituting laser devices of a laser oscillation-operating area of said semi-conductor laser array apparatus and the other semi-conductor laser devices constituting laser devices of the non-laser oscillation-operating areas that are positioned outside of said laser oscillation-operating area, wherein the oscillation threshold current level of at least one of the semiconductor laser devices of each of said non-laser oscillation-operating areas that is the closest to said laser oscillation-operating area is higher than those of the semiconductor laser devices of said laser oscillation-operating area.

In a preferred embodiment, at least one of the semiconductor laser devices of each of said non-laser oscillation-operating areas that is the closest to said laser oscillation-operating area contains single or plural grooves that are formed in a discontinuous manner in the direction from one facet to the other.

In a preferred embodiment, at least one of the semiconductor laser devices of each of said one-laser oscillation-operating areas that is the closest to said laser oscillation-operating area contains single or plural grooves that are constricted in given portions.

In a preferred embodiment, the reflectivity of the portions of the facets that correspond to said non-laser oscillation-operating areas is lower than that of the portion of one facet that corresponds to said laser oscillation-operating area. The portions of the facets with a lower reflectivity are coated by a single layer, whereas said portion of the facet with a higher reflectivity is coated by a multi-layer.

Thus, the invention described therein makes possible the objective of providing a semiconductor laser array apparatus in which even when current leaks into the non-laser oscillation-operating areas, laser oscillation of the semiconductor laser devices in the non-laser oscillation-operating areas is suppressed and laser oscillation in the laser oscillation-operating area alone is attained, resulting in a stabilized synchronous-oscillation mode.

BRIEF DESCRIPTION OF THE DRAWINGS

This invention may be better understood and its numerous objects and advantages will become apparent to those skilled in the art by reference to the accompanying drawing as follows.

DESCRIPTION OF THE PREFERRED EMBODIMENTS

This invention provides a semiconductor laser array apparatus in which the oscillation threshold current level of the semiconductor laser devices in the non-laser oscillation-operating areas is set to be higher than that of the semiconductor laser devices in the laser oscillation-operating area, and accordingly even when current leaks in the lateral direction, the laser devices of the non-laser oscillation-operating areas oscillate no laser, but only the laser devices of the laser oscillation-operating area oscillate laser, so that a stabilized synchronous-oscillation mode can be attained.

EXAMPLE 1

Figure 1A:
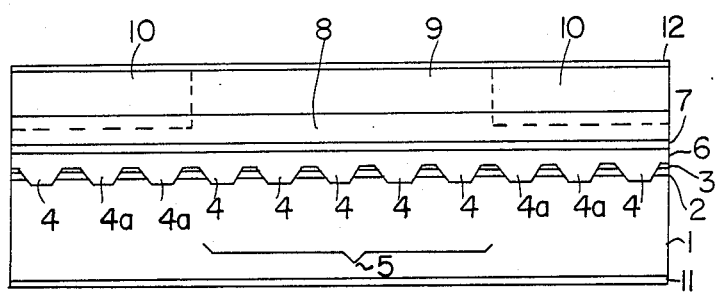
FIG. 1A is a front sectional view showing a semiconductor laser array apparatus of this invention.
Figure 1B:
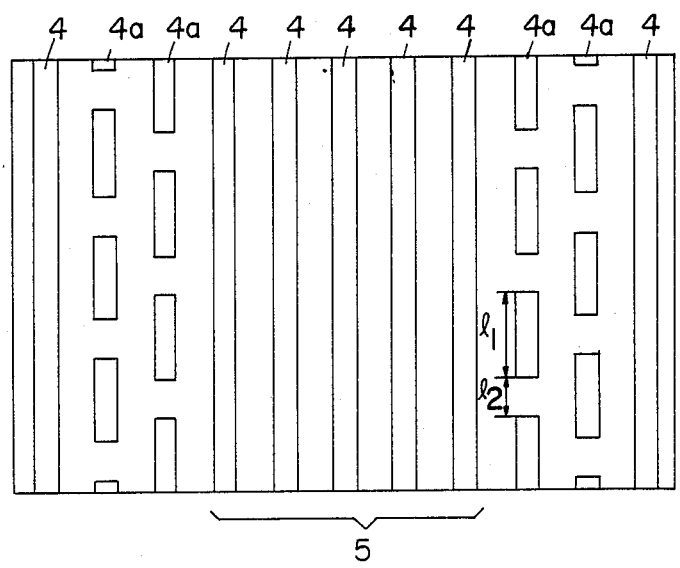
FIG. 1B is a plane view showing the grooves formed on the substrate of the laser array apparatus shown in FIG. 1A.

FIG. 1A shows a semiconductor laser array apparatus of this invention, which is produced as follows: On a p-GaAs substrate 1, an n-$Ga_{0.9}Al_{0.1}As$ current blocking layer (a first current blocking layer) 2 with a thickness of 0.7 $\mu$m and an n-GaAs current blocking layer (a second current blocking layer) 3 with a thickness of 0.1 $\mu$m are successively formed by liquid phase epitaxy. Then, a plurality of grooves 4 and 4a with a width of 4 $\mu$m each, a depth of 1.0 $\mu$m each, and a pitch of 5 $\mu$m each are formed on the entire surface of the second current blocking layer 3 by photolithography and an etching technique in such a way that they reach the p-GaAs substrate 1 through both the n-GaAs current blocking layer 3 and the n-$Ga_{0.9}Al_{0.1}As$ current blocking layer 2. As shown in FIG. 1B, the grooves 4 that are positioned corresponding to the laser oscillation-operating area 5 are formed into a striped shape from one facet to the other, whereas the grooves 4a that are positioned in the non-laser oscillation-operating areas at the outside of the laser oscillation-operating area 5 are formed in a discontinuous manner in the direction from one facet to the other. At least the closest groove 4a to the laser oscillation-operating area 5 is formed in such a discontinuous manner. In this example, two grooves 4a that are outside of the laser oscillation-operating area 5 are formed in a discontinuous manner in the direction from one facet to the other. The length $l_1$ of each piece of the groove 4a is, for example, 20 $\mu$m and the distance $l_2$ between the adjacent pieces of the groove 4a is, for example, 10 $\mu$m.

Then, as shown in FIG. 1A, on the second current blocking layer 3 including the grooves 4 and 4a, a p-$Ga_{1-x}Al_xAs$ cladding layer 6 having a thickness of 0.2 $\mu$m in the area other than the grooves 4 and 4a, a p-(or n-)$Ga_{1-y}Al_yAs$ active layer 7 with a thickness of 0.08 $\mu$m, an n-$Ga_{1-x}Al_xAs$ cladding layer 8 with a thickness of 1.0 $\mu$m, and an n-GaAs cap layer 9 with a thickness of 1.5 $\mu$m are successively formed. Then, protons are injected into both the GaAs cap layer 9 and the p-$Ga_{1-x}Al_xAs$ cladding layer 8 at the outside of the laser oscillation-operating area 5 by an ion-injecting technique in such a manner that the protons reach the cladding layer 8 through the cap layer 9, resulting in a high resistance layer 10. Then, a p-side electrode 11 and an n-side electrode 12 are formed on the bottom face of the p-GaAs substrate 1 and the top surface of the n-GaAs cap layer 9, respectively, resulting in a semiconductor laser array apparatus.

Even when current injected into this laser array apparatus leaks into the areas other than the laser oscillation-operating area 5, because of the discontinuous grooves 4a positioned outside of the laser oscillation-operating area 5, the amount of light that is to be absorbed toward the substrate 1 at the boundaries among the pieces of the grooves 4a increases, resulting in an increase in optical internal losses, which causes difficulties in laser oscillation of the semiconductor laser devices containing the said grooves 4a. As a result, laser oscillation is attained only in the laser oscillation-operating area 5, and optical coupling is not achieved between the waveguide of the laser oscillation-operating area and the adjacent waveguide of the non-laser oscillation-operating area outside of the said laser oscillation-operating area 5. Thus, a stabilized synchronous oscillation can be attained.

EXAMPLE 2

Figure 2A:
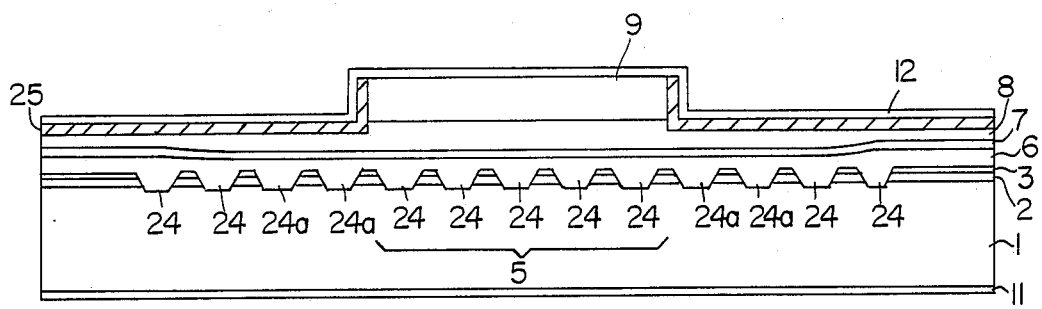
FIG. 2A is a front sectional view showing another semiconductor laser array apparatus of this invention.
Figure 2B:
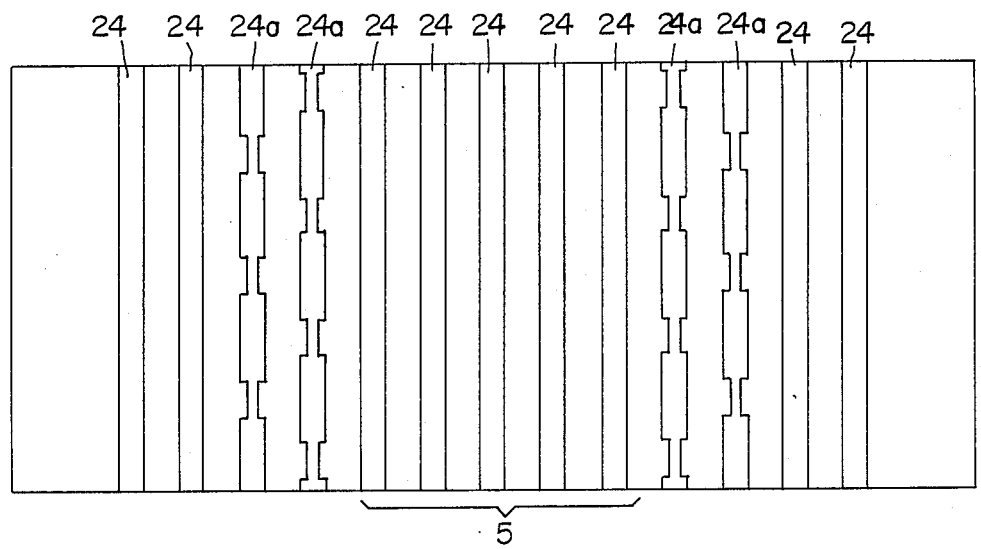
FIG. 2B is a plane view showing the grooves formed on the substrate of the laser array apparatus shown in FIG. 2A.

FIG. 2A shows another embodiment laser array apparatus of this invention, which is produced as follows: In the same way as described in Example 1, on a p-GaAs substrate 1, an n-$Ga_{0.9}Al_{0.1}As$ current blocking layer (a first current blocking layer) 2 and an n-GaAs current blocking layer (a second current blocking layer) 3 are successively formed by liquid phase epitaxy. Then, a plurality of grooves 24 and 24a are formed on the second current blocking layer 3 in such a way that they reach the substrate 1 through the current blocking layers 3 and 2. As shown in FIGS. 2B, the grooves 24 that are positioned corresponding to the laser oscillation-operating area 5 are formed into a striped shape from one facet to the other, whereas the grooves 24a that are positioned in the non-laser oscillation-operating areas outside of the laser oscillation-operating area 5 are formed so that they are constricted in given portions. At least the closest groove 24a to the laser oscillation-operating area 5 is formed in a constricted manner. In this example, two grooves 24a that are outside of the laser oscillation-operating area 5 are formed in a constricted manner; for example, the width of the constricted portions of each groove 24a is 2 $\mu$m and the width of the other portions thereof is 4 $\mu$m. The depth of the constricted portions thereof is the same as or shallower than that of the other portions thereof. These grooves are not disposed over the entire surface of the substrate 1, but the grooves 24 and 24a that are positioned outside of the laser oscillation-operating area 5 are disposed over the area with the same width as that of the laser oscillation-operating area 5. Accordingly, there are no grooves 24 and 24a in the areas in the vicinity of both sides of the substrate 1. The portions of the active layer 7 that are formed above the grooves 24 in the outer sides are bent, but this phenomenon has no influence on the formation of the portion of the active layer of the laser oscillation-operating area 5. Therefore, the portion of the active layer 7 that corresponds to the laser oscillation-operating area 5 can by uniformly formed.

Thereafter, as shown in FIG. 2A, on the $Ga_{1-y}Al_yAs$ active layer 7, an $n-Ga_{1-x}Al_xAs$ cladding layer 8 and an n-GaAs cap layer 9 are successively formed in the same way as described in Example 1. Then, the portions of the n-GaAs cap layer 9 and the $n-Ga_{1-x}Al_xAs$ cladding layer 8 that correspond to the non-laser oscillation-operating areas are removed by a chemical etching technique in a manner to reach the cladding layer 8 through the cap layer 9. Then, a $Si_3N_4$ film 25 is formed on the exposed surfaces of the cap layer 9 and the cladding layer 8, after which a p-side electrode 11 and an n-side electrode 12 are formed on the bottom face of the p-GaAs substrate 1 and the top surface of the n-GaAs cap layer 9, respectively, resulting in a semiconductor laser array apparatus.

Even when current injected into this laser array apparatus leaks into the non-laser oscillation-operating areas, because of the constricted portions of the grooves 24a positioned outside of the laser oscillation-operating area 5, the amount of light that is to be absorbed at the shoulder portions of the constricted grooves 24a increases and optical internal losses are increased, thereby attaining the same effect as that of Example 1.

The method for confining current within the laser oscillation-operating area 5 of the active layer 7 is not limited to that of the above-mentioned example, but the inner-current confining method, the oxidation film stripe method, planer stripe method, and so on can be employed, which also attain the same effect as the above-mentioned.

EXAMPLE 3

Figure 3A:
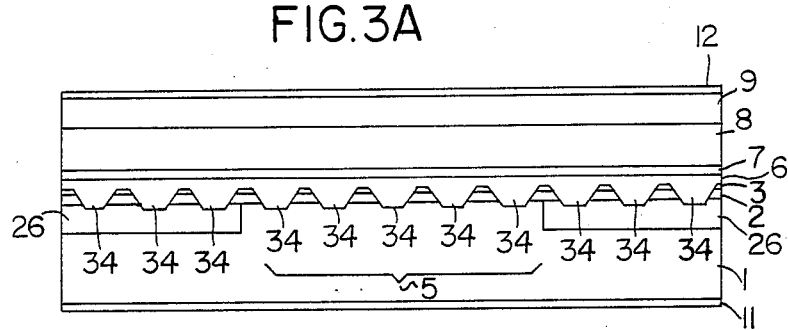
FIG. 3A is a front sectional view showing another semiconductor laser array apparatus of this invention.
Figure 3B:
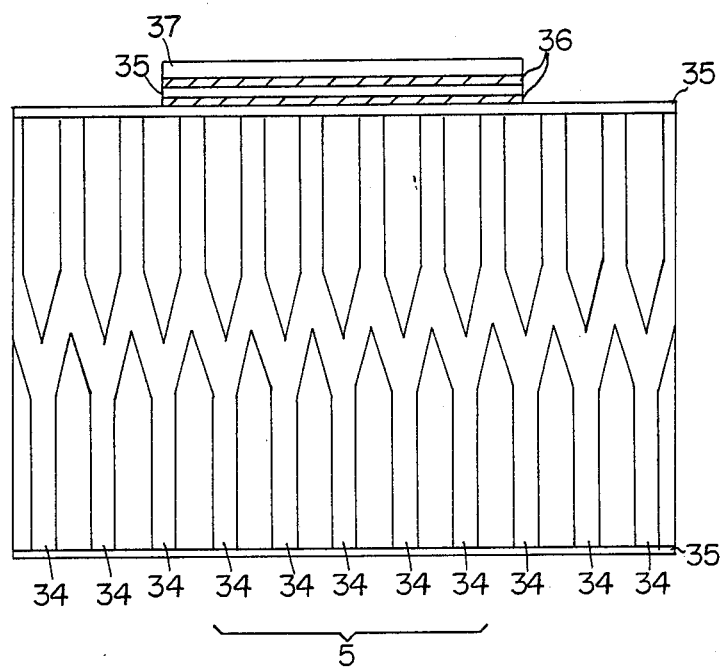
FIG. 3B is a plane view showing the grooves formed on the substrate of the laser array apparatus shown in FIG. 3A.
Figure 4:
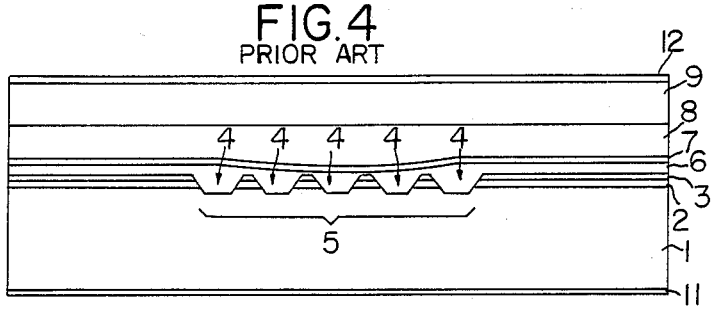
FIGS. 4, 5 and 6 are front sectional views showing conventional semiconductor laser array apparatuses.
Figure 5:
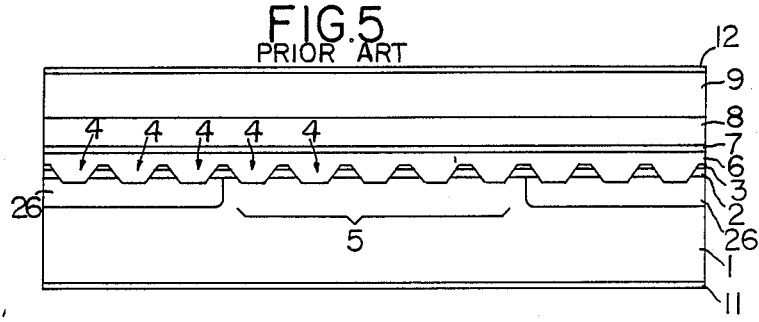
Figure 6:
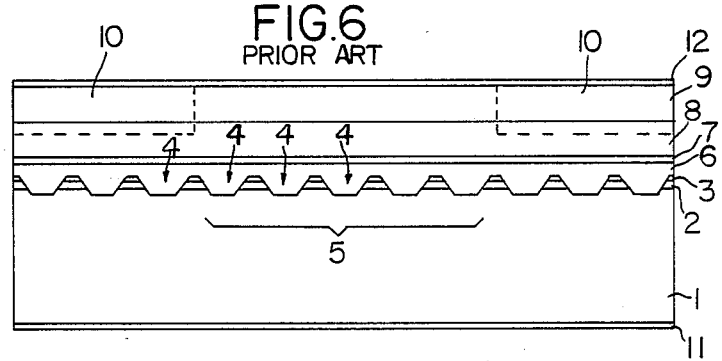

FIG. 3A shows another semiconductor laser array apparatus of this invention, which is produced in the same way as that of Example 1, except for the following: The grooves 34 by which optical waveguides are formed within the active layer 7 have a symmetrically branching structure, as shown in FIG. 3B, which is composed of parallel stripes with a width of 4 $\mu$m each and a pitch of 5 $\mu$m that are positioned from both facets to the middle of the wafer and branching portions that attain optical coupling in the middle of the wafer between the corresponding parallel stripes. Moreover, in the areas at the outside of the laser oscillation-operating area 5, there is an n-GaAs current blocking layer 26 between the p-GaAs substrate 1 and the $n-Ga_{0.9}Al_{0.1}As$ current blocking layer 2, which prevents current from being injected into the portions of the active layer 7 that are positioned above the said current blocking layers 26, resulting in non-laser oscillation-operating areas that are positioned outside of the laser oscillation-operating area 5. Moreover, $Al_2O_3$ films 35 with an optical thickness of $\lambda/4$ ($\lambda$ is a light wavelength) are formed on both facets by the ordinary electron beam method. Then, on the portion of the $Al_2O_3$ film 35 one facet that corresponds to the laser oscillation-operating area 5, an amorphous silicon film 36 with an optical thickness of $\lambda/4$, an $Al_2O_3$ film 35 with an optical thickness of $\lambda/4$, and an amorphous silicon film 36 with an optical thickness of $\lambda/4$ are successively formed by the lift-off method using resist films therein, followed by forming an $Al_2O_3$ film 37 with an optical thickness of $\lambda/2$ on the amorphous silicon film 36, resulting in a semiconductor laser array apparatus with a reflectivity of 2-4% in one single-layered facet, a reflectivity of 95% in the multi-layered portion of the other facet that corresponds to the laser oscillation-operating area 5, and a reflectivity of 2-4% in the other portions of the other facet that correspond to the non-laser oscillation-operating areas.

Because of the above-mentioned structure, mirror losses of the optical waveguides in the non-laser oscillation-operating areas become large and accordingly even when current leaks into the said areas, laser oscillation never arises, resulting in the same effect as that of Example 1.

In the above-mentioned examples, the semiconductor laser devices of the non-laser oscillation-operating areas outside of the oscillation-operating area 5 are designed so that the grooves are discontinued or constricted in given portions or the reflectivity of the facets corresponding thereto are lowered, which makes the oscillation threshold current level high. Accordingly, even when current leaks into the non-laser oscillation-operating areas, laser oscillation is attained by only the semiconductor laser devices of the laser oscillation-operating area 5. However, the oscillation threshold current level of the semiconductor laser devices that are positioned outside of the laser oscillation-operating area 5 can be, of course, made high by other methods.

Although the above-mentioned examples only disclose GaAs-GaAlAs semiconductor laser array apparatuses, this invention is applicable to semiconductor laser array apparatuses of the InGaAsP-InP systems or the like. Moreover, this invention is applicable to semiconductor laser array apparatuses in which the oxidation film stripe method, the planer stripe method using a diffusion technique, or the like is used as a current-confining method.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. In a semiconductor laser array apparatus comprising a single substrate and a plurality of semiconductor laser devices that are disposed with a given pitch on said substrate, some of the semiconductor laser devices constituting laser devices of a laser oscillation-operating area of said semiconductor laser array apparatus and the other semiconductor laser devices constituting laser devices of the non-laser oscillation-operating areas that are positioned outside of said laser oscillation-operating area, wherein at least one of the semiconductor laser devices of each of said non-laser oscillation-operating areas that is the closest to said laser oscillation-operating area contains single or plural grooves and the oscillation threshold current level of at least one of the semiconductor laser devices of each of said non-laser oscillation-operating areas that is the closest to said laser oscillation-operating area is higher than those of the semiconductor laser devices of said laser oscillation-operating area.

2. A semiconductor laser array apparatus according to claim 1, wherein said single or plural grooves of said semiconductor laser devices of each of said non-laser oscillation-operating areas are formed in a discontinuous manner in the direction from one facet to the other.

3. A semiconductor laser array apparatus according to claim 1, wherein said single or plural grooves of said semiconductor laser devices of each of said non-laser oscillation-operating areas are constricted in given portions.

4. A semiconductor laser array apparatus according to claim 1, wherein the reflectivity of the portions of the facets that correspond to said non-laser oscillation-operating areas is lower than that of the portion of open facet that corresponds to said laser oscillation-operating area.

5. A semiconductor laser array apparatus according to claim 4, wherein said portions of the facets with a lower reflectivity are coated by a single layer, whereas said portion of the facet with a higher reflectivity is coated by a multi-layer.

* * * * *